(12) United States Patent
Dowhan et al.

(10) Patent No.: US 6,463,992 B1
(45) Date of Patent: Oct. 15, 2002

(54) METHOD OF MANUFACTURING SEAMLESS SELF-SUPPORTING AERODYNAMICALLY CONTOURED SHEET METAL AIRCRAFT ENGINE PARTS USING NICKEL VAPOR DEPOSITION

(75) Inventors: Michael John Dowhan, Milton; Joseph Horace Brand, Mississauga; Andreas Eleftheriou, Woodbridge; Andrew Robertson Waterston, Toronto, all of (CA)

(73) Assignee: Pratt & Whitney Canada Corp., Quebec (CA)

( * ) Notice: Subject to any disclaimer, the term of this patent is extended or adjusted under 35 U.S.C. 154(b) by 0 days.

(21) Appl. No.: 09/532,302

(22) Filed: Mar. 22, 2000

(51) Int. Cl.[7] .......................... B22D 23/00; B22D 29/00
(52) U.S. Cl. ........................................ 164/46; 164/131
(58) Field of Search ............................ 164/46, 75, 91, 164/6, 9, 19, 44, 131, 132, 344, 346; 118/715; 427/133, 135, 248.1, 250, 305

(56) References Cited

U.S. PATENT DOCUMENTS

| 2,821,013 | A |   | 1/1958  | Schell ........................... 29/195 |
|-----------|---|---|---------|-------------------------------------------|
| 3,024,506 | A |   | 3/1962  | Trimble ......................... 164/12   |
| 3,135,044 | A |   | 6/1964  | Mote, Jr. et al. .............. 29/423    |
| 4,294,303 | A | * | 10/1981 | Flesburg ....................... 164/44   |
| 4,447,466 | A | * | 5/1984  | Jackson et al. ............... 427/34     |
| 4,567,066 | A |   | 1/1986  | Schultz et al. .............. 427/305    |
| 4,588,480 | A |   | 5/1986  | Thoma ...................... 204/37.1     |
| 4,687,702 | A |   | 8/1987  | Monsees ................... 428/308.4     |
| 4,820,126 | A | * | 4/1989  | Gavilan ....................... 416/221   |
| 4,840,820 | A |   | 6/1989  | Schultz et al. .............. 427/305    |
| 4,867,223 | A | * | 9/1989  | Matsumura et al. .......... 164/46       |
| 5,169,549 | A |   | 12/1992 | Weber .......................... 249/80   |
| 5,169,685 | A |   | 12/1992 | Woodruff et al. ........... 427/250      |
| 5,362,580 | A |   | 11/1994 | Ferrando et al. ............ 429/245     |
| 5,407,487 | A |   | 4/1995  | Weber et al. ................ 118/728    |
| 5,444,912 | A |   | 8/1995  | Folmer ..................... 29/890.01   |
| 5,470,651 | A | * | 11/1995 | Milinkovic et al. .......... 428/325     |
| 5,591,485 | A |   | 1/1997  | Weber et al. ................ 427/250    |
| 5,750,160 | A |   | 5/1998  | Weber et al. ................ 425/290    |
| 5,753,304 | A |   | 5/1998  | Tung .......................... 427/304  |
| 5,766,683 | A |   | 6/1998  | Waibel ....................... 427/252   |
| 5,934,157 | A |   | 8/1999  | Kobayashi et al. ........... 74/640      |

FOREIGN PATENT DOCUMENTS

JP          06143354          5/1994

OTHER PUBLICATIONS

Black T W: "Toolmaking without Machining . . . Long Term Research Pays Off" Tool Engineer, Society of Manufacturing Engineers, Milwaukee, U.S. vol. 6 No. 44, Jun. 1, 1960, pp. 101–104, XP002075716.

* cited by examiner

Primary Examiner—M. Alexandra Elve
Assistant Examiner—Kevin P. Kerns
(74) Attorney, Agent, or Firm—Bachman & LaPointe, P.C.

(57) ABSTRACT

A method of manufacturing a seamless self-supporting metal part using nickel vapor deposition, where the part has a selected minimum thickness, a first aerodynamically contoured surface and a second substantially parallel surface. The method replaces labor intensive welding of individually manufactured sheet metal segments for complex aerodynamic shapes, and produces a part with higher accuracy, less cost, controlled strength and hardness properties. Nickel vapor deposition is commonly used for plating electronic components, and for producing a metallic lining for plastic injection moulds. The seamless sheet metal part is cast by: fabricating a mould with at least one mould surface being a negative of the first surface of the part; enclosing the mould in a nickel vapor deposition chamber; depositing nickel on the mould surface by nickel vapor deposition until a blank of nickel is deposited having at least the minimum thickness and an external deposition surface; and separating the blank from the mould.

15 Claims, 3 Drawing Sheets

METHOD OF MANUFACTURING SEAMLESS SELF-SUPPORTING AERODYNAMICALLY CONTOURED SHEET METAL AIRCRAFT ENGINE PARTS USING NICKEL VAPOR DEPOSITION

The invention concerns a method of manufacturing a seamless self-supporting sheet metal part using the nickel carbonyl vapour deposition process to replace conventional sheet metal parts that are formed from flat blanks and welded or brazed together.

Conventional methods of forming sheet metal parts by various methods are well known in the art generally involving the use of flat sheet metal stock or coils of sheet metal which are flattened prior to cutting into various flat blank shapes.

Finished sheet metal components for various uses are conventionally bent, roll-formed, stamped and formed into shapes that are combined with other shapes and welded or brazed into a final sheet metal assembly.

In the production of aircraft engines in particular, the geometric complexity of sheet metal components and the accuracy required can be very demanding. The efficiency of an aircraft engine may depend heavily on the degree of shape accuracy of the fabrication of various sheet metal components. The surface finish of the components and finish of welds and other surface discontinuities can lead to aerodynamic inefficiencies, stress concentrations or possibly fatigue failure under thermal or dynamic loading.

As a consequence, the complex shapes constructed of sheet metal for aircraft engines involve a high degree of precision, skill, quality control, rework, part rejection and the necessary expenditure of time and money to produce acceptable results.

An example of a complex sheet metal component is an exhaust mixer for an aircraft engine. This component is an annular ring with a pleated or accordion-like skirt which serves to mix the cold engine bypass flow and hot engine exhaust gasses at the tail of the engine. Such complex shapes are generally fabricated by cutting and forming smaller segments in a sheet metal die press then assembling the components together in a complex welding jig. The fitting and assembly of multiple components inherently involves a degree of inaccuracy. As well, the introduction of heat to thin sheet metal components during welding introduces inaccuracies and heat distortion as the adjacent metal expands and contracts. Welding of aerodynamic shapes is less than ideal since the surface of welded areas must be ground, polished or finished to preserve the surface aerodynamic properties of the part. The heat from welding induces residual stresses which are locked into the structure and require heat treating to relieve these built-in stresses, that introduces distortion.

Where the accuracy of forming thin metal components is critical, the part may be machined from a casting or forging. However, machining involves relatively high expenses and labour as well as significant cycle time in manufacture. Accordingly, machining of very thin sheet metal components can be considered as the last resort that is only justified where the high cost of machining is necessary to ensure the accuracy and efficiency of the engine component. In some cases it is not possible to achieve the desired thickness.

U.S. Pat. No. 5,444,912 to Folmer shows a method of forming a flat blank into an exhaust mixer using hydraulic pressure and a complex forming jig. However, due to the complexity of this mechanism and the need to manufacture a separate jig for each different exhaust mixer configuration, this approach is of limited application.

A far greater disadvantage of conventional methods however is that the aerodynamic efficient design of the exhaust mixer and other sheet metal components are severely restricted by the method of manufacture.

The designers of aircraft engines may in theory design shapes for various components, that would result in increases in efficiency or optimize efficiency. However, these innovations are rendered impractical and uneconomical since the complex shapes that result would be prohibitively expensive to manufacture using conventional metal forming methods.

Therefore, the efficiency of an aircraft engine is severely restricted not by lack of technical design expertise but by the manufacturing methods used for economically producing the sheet metal components.

To date, the trade-off between efficiency of design and efficiency of manufacture has favoured manufacturing due to the high cost of producing complex sheet metal shapes.

The inventors have recognized that nickel vapour deposition may be utilized to produce complex sheet metal surfaces despite the relatively high cost involved and the long periods of time required to deposit pure nickel on a mould surface. In addition, the 99.9% pure nickel deposited in this process has limited capacity for heat resistance making it unsuitable for applications where operating temperatures exceed 900° F.

Despite these limitations and the generally high temperatures inside aircraft engines, the inventors have recognized that engine exhaust mixers can justify this slow and expensive process being complex sheet metal components exposed to relatively low temperatures of about 600° F. Cost/Benefit analysis will also reveal other sheet metal components for various low temperature applications where the invention can be justified within gas turbine engines and elsewhere to replace conventional sheet metal fabrications.

Nickel vapour deposition is commonly utilized for low temperature nickel plating of electrodes or other metal clad components as illustrated in the following U.S. patents: U.S. Pat. No. 4,687,702 to Monsees for applying a metal layer on one surface of a polyamide foam; and U.S. Pat. No. 5,362,580 to Ferrando et al. for a nickel coated lightweight battery electrode.

Another common application of nickel vapour deposition is in the manufacture of nickel plated moulds for plastic injection moulding. Various methods and apparatus for producing nickel plated moulds for plastic injection moulding are described in U.S. Pat. No. 5,591,485 to Weber et al. U.S. Pat, No. 5,470,651 to Milinkovic et al. and U.S. Pat. No. 5,570,160 to Weber et al.

In the prior art, the nickel deposition process is used to apply a thin very accurate plating or coating on a substrate. The nickel coating layer conventionally provides the properties of electrical conductivity or wear resistance as in U.S. Pat. No. 5,934,157 to Kobayashi et al. In the case of manufacturing plastic moulds, nickel deposition is used to provide an accurate mould surface that is rigid, wear resistant and accurately reproduces the shape and profile of a master part for reproduction in a plastic moulding.

In general, nickel vapour deposition is well known and will be described here only in general terms. U.S. Pat. No. 5,766,683 to Waibel describes a nickel deposition system with a carbon monoxide and vapour recovery system. Pure nickel on exposure to carbon monoxide produces nickel carbonyl vapour, which is contained within an enclosed deposition chamber. The substrate to be coated with a nickel layer is positioned within the chamber and exposed to the nickel carbonyl vapour. When the substrate is heated to a predetermined temperature, the nickel carbonyl vapour decomposes on the substrate. Elemental nickel is plated on the substrate and carbon monoxide gas is emitted. Nickel vapour deposition systems generally include means to withdraw the carbon monoxide gas and recycle the CO gas to produce a continuous supply of nickel carbonyl vapour for deposition.

Depending on the size of the mould or substrate to be coated, nickel vapour deposition generally progresses at a rate much greater than conventional plating to build up a thin plated layer on the substrate at a rate of up to 0.010 inches per hour. During the deposition process, it is critical to maintain the temperature of the substrate within a specified range to ensure that decomposition of the nickel carbonyl gas is maintained and deposition of nickel continues.

Where plastic moulds are produced using nickel vapour deposition, a negative mould surface with a nickel plating layer accurately reproduces the positive master. However, on the opposite surface where deposition occurs, the continuous addition of pure nickel on the surface exposed to the nickel carbonyl vapour rapidly covers surface details, loses definition and a non-uniform layer thickness of nickel results in loss of detail as the thickness of the layer is increased. However, the intent of forming nickel plated moulds is to produce a single side, which is used as an accurate negative of the component to be moulded. The side of the nickel shell opposite the negative mould side is often encased in resins or reinforced in various ways to produce the final nickellined mould. Therefore, the opposite side of the nickel plated layer is given no consideration except to the extent that it provides a base for reinforcing the thin nickel mould surface. The nickel layer is thin and prone to distortion if removed from the master. Therefore mould making includes encasing or reinforcing the deposited side in resins before removal from the master.

It is an object of the present invention to utilize nickel vapour deposition to form sheet metal components having highly complex inner and substantially parallel outer surfaces. The reverse is also true in that the mould could represent the outer surface and the inner deposited surface is parallel to the outer surface.

It is a further object of the invention to provide a means of fabricating sheet metal components that free the designer from the restrictions imposed by conventional manufacturing procedures such as welding and forming from flat plate blanks.

Further objects of the invention will be apparent from review of the disclosure, drawings and description of the invention below.

The invention provides a novel method of manufacturing a seamless self-supporting metal part using nickel vapour deposition, where the part has a selected minimum thickness, a first aerodynamically contoured surface and a second substantially parallel surface. The method replaces labour intensive welding of individually manufactured sheet metal segments for complex aerodynamic shapes, and produces a part with higher accuracy, less cost, controlled strength and hardness properties. Nickel vapour deposition is commonly used for plating electronic components, and for producing a relatively thick metallic lining on plastic injection moulds.

The seamless sheet metal part is manufactured by: fabricating a mould with at least one mould surface being a negative of the first surface of the part; enclosing the mould in a nickel vapour deposition chamber; heating the mould continuously while depositing nickel on the mould surface by nickel vapour deposition until a blank of nickel is deposited having at least the minimum thickness required and an external deposition surface; and separating the blank from the mould.

The invention therefore provides an alternative means to produce complex sheet metal parts. Conventional methods of forming parts from flat plates and welding segments together involves a significant compromise in that the efficient design of sheet metal components is limited by the manufacturing methods that are currently economical.

Cutting flat blanks from flat metal sheets and forming the blanks, assembling the formed segments in a jig and welding involves significant expenditure of time and skilled labour and inevitably results in heat distortion and inaccuracies due to the inherent difficulty in applying heat to thin sheet metal during welding and accurate fitting and assembling.

Nickel vapour deposition as well results in a pure nickel coating, which has limited application due to its relatively low resistance to heat. However, the inventors have recognized that nickel vapour deposition, despite its limitations may provide an economic means for manufacturing specific components which in an aircraft engine are not exposed to high heat such as an exhaust mixer for an aircraft engine.

The invention therefore provides means to manufacture a seamless one-piece sheet metal component which is free from thermally induced distortions and stresses, mechanical stresses from cold working and the inherent increased risk of fatigue failure due to cold working of sheet metal. The invention ensures smooth aerodynamic shapes without the need to grind welds or otherwise finish the external and internal surfaces. Also, the nickel vapour deposition chamber provides a contaminant free environment in which a pure nickel homogenous material may be deposited. The pure nickel component has enhanced strength, hardness and improved durability as a result of manufacture in a seamless manner.

In order that the invention may be readily understood, one embodiment of the invention is illustrated by way of example in the accompanying drawings.

Further details of the invention and its advantages will be apparent from the detailed description included below.

Figure 1:
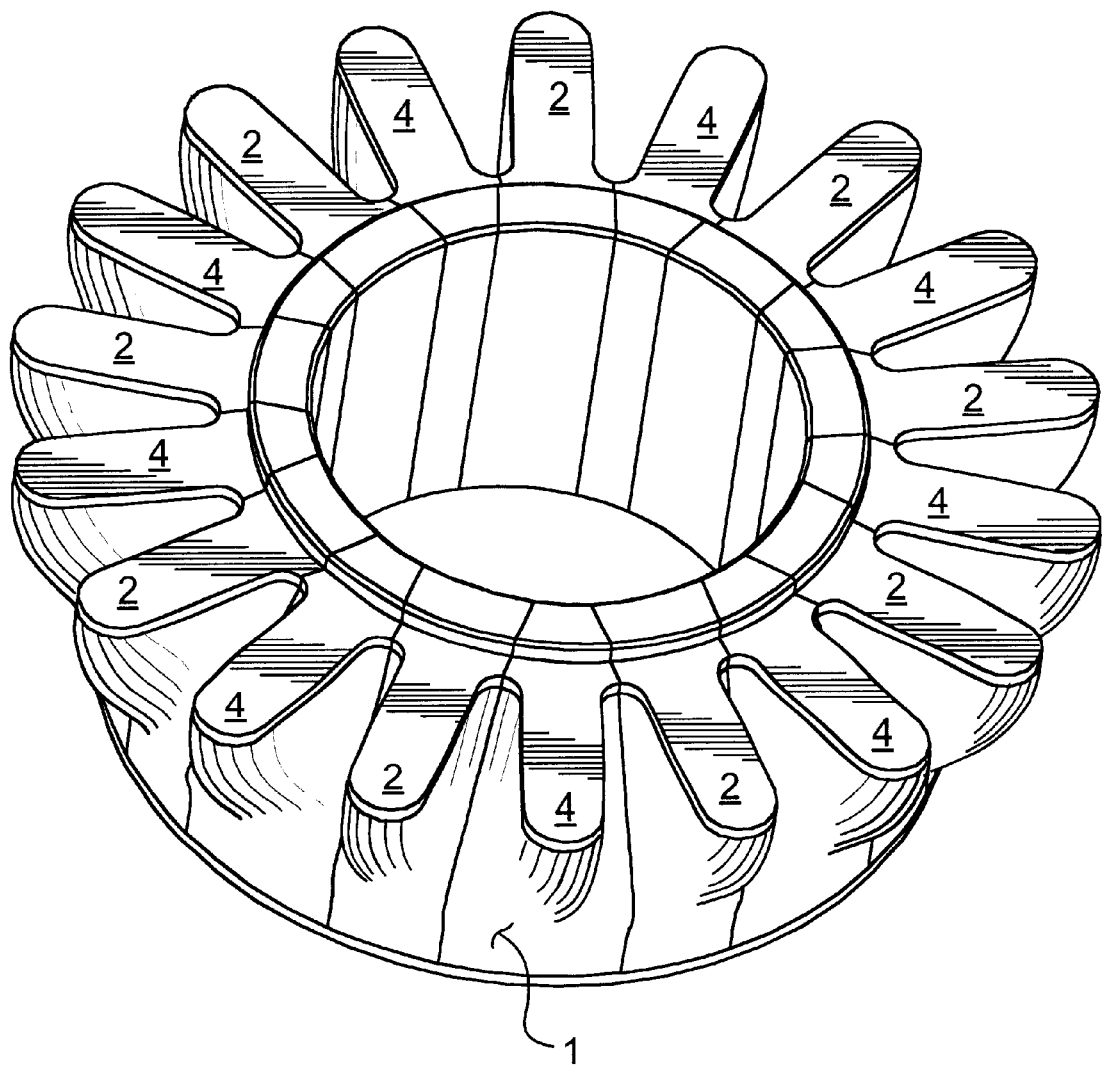
FIG. 1 is a top perspective view of an assembled mould with exterior mould surface configured to nickel vapour deposit a sheet metal exhaust mixer for an aircraft engine.
Figure 2:
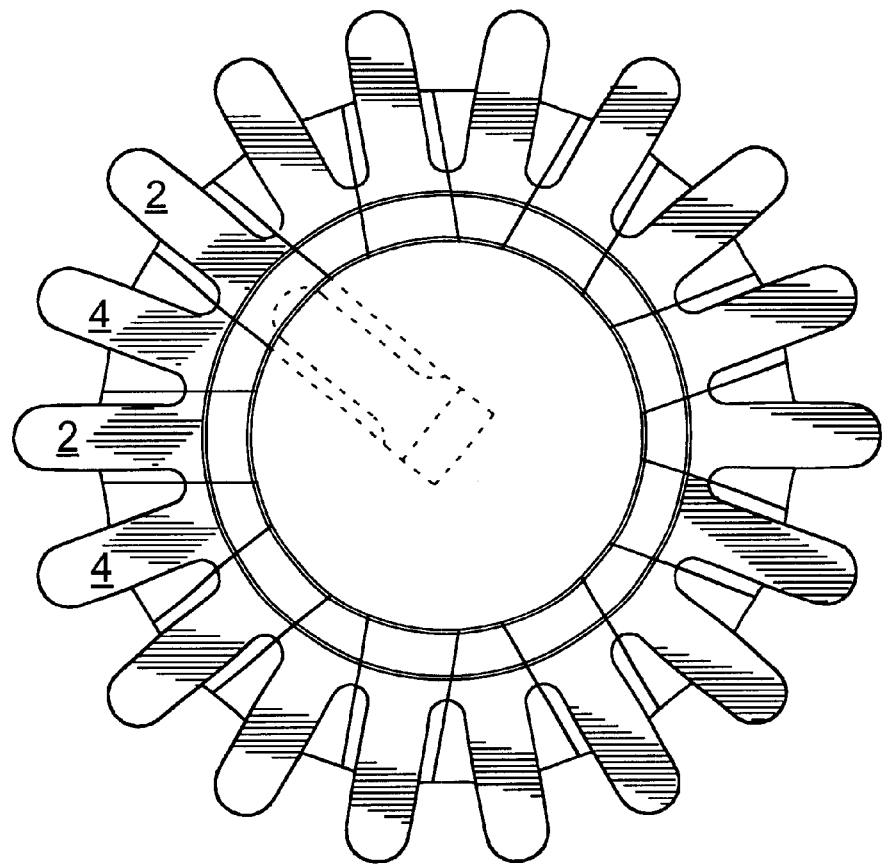
FIG. 2 is a plan top view of the mould shown in FIG. 1 comprised of alternating block segments showing one block segment with parallel sides in dotted outline indicating the means by which the annular assembly of blocks are withdrawn from the finished sheet metal part.
Figure 3:
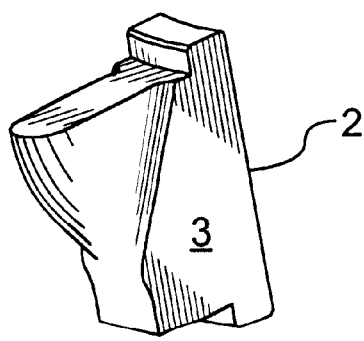
FIG. 3 is a side perspective view of a mould block segment having parallel side surfaces.
Figure 4:
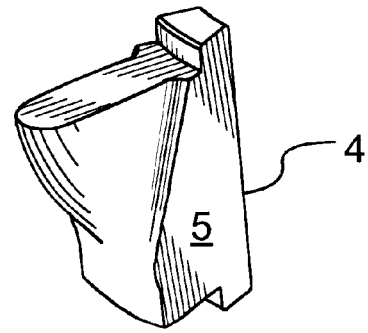
FIG. 4 is a like side perspective view of a second mould block segment having surfaces disposed at an acute angle relative to each other.
Figure 5:
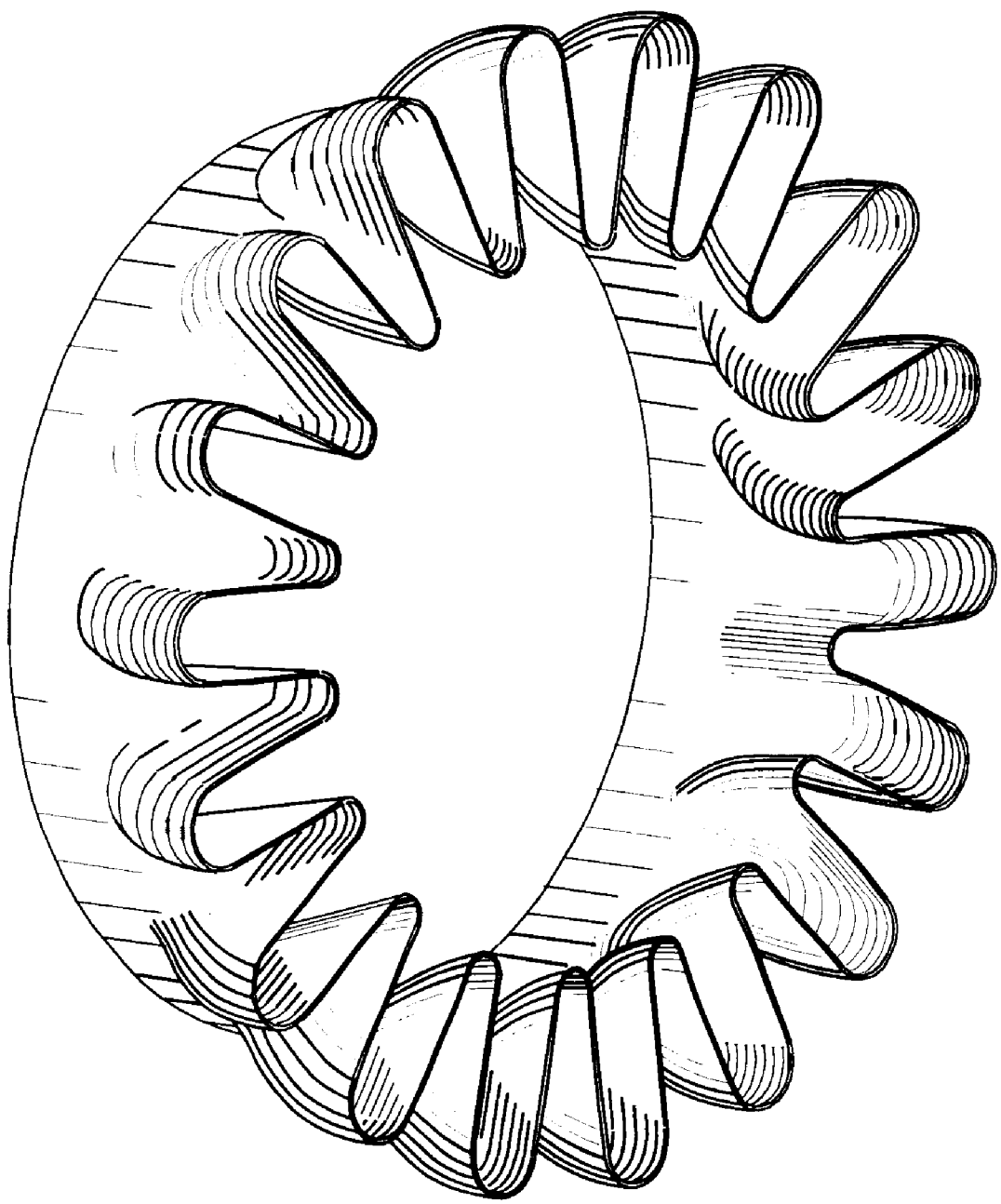
FIG. 5 is a perspective view of the completed sheet metal part.

FIG. 1 illustrates one embodiment of the mould where the mould surface 1 is an exterior surface of the assembled annular mould built up of alternating first block segments 2 having parallel side surfaces 3 (see FIG. 3) and second block segments 4 having side surfaces 5 (see FIG. 4) abutting the parallel surfaces 3 of the first block and being disposed at an acute angle relative to each other as best seen in FIG. 2.

As shown in dotted outline in FIG. 2, the segments 2 and 4 are inwardly removable after the nickel deposition process is completed to permit the deposited nickel blank to be separated from the mould. As well, portions of the mould can be masked to prevent deposition of nickel on unwanted areas of the mould.

In order to manufacture a seamless self-supporting metal part using nickel vapour deposition according to the invention, the first step is to fabricate a mould with at least one mould surface 1 that represents a negative of a first surface of the desired part. The seamless sheet metal part has a minimum wall thickness with a first aerodynamically contoured surface in a second substantially parallel surface. The first contoured surface of the seamless part is formed by deposition on the negative mould surface 1 of the assembled mould. The second parallel contoured surface of the part represents the exposed or external surface of the part blank on which nickel vapour deposition has occurred in the deposition chamber.

In conventional nickel vapour deposition, the mould or mandrel is heated in a controlled manner by various means such electrical induction heaters or circulation of heated oil. The temperatures at the surface of the mould 1 and at the exposed surface of the nickel deposition layer determine the rate of nickel carbonyl decomposition and the rate of formation of metallic nickel on the mould. Choice of mandrel material and geometry is carefully made to ensure even temperature distribution and hence uniform deposition rate.

Within the chamber, nickel is deposited on the mould surface 1 by nickel vapour deposition until a blank of nickel is deposited having at least the predetermined minimal thickness and a external surface generally parallel to the internal surface of the blank adjacent the mould surface 1. After the desired minimum thickness has been obtained, the mould and blank are removed from the deposition chamber and the blank is separated from the mould.

In the preferred embodiment, the mandrel is made of a material allowing easy separation of the part from the mould. As shown in FIG. 2, the blank is removed from the mould by disassembling the mould. To disassemble the mould, the first blocks 2 are removed inwardly and thereafter the second blocks 4 can be easily removed inwardly. The blocks 2 and 4 are cleaned if necessary and reassembled for repetition of the deposition process.

It is expected however, that since the first blank surface is formed directly on the mould surface of the mould assembly, very little finishing will be required on the surface. Nickel vapour deposition reproduces the exact configuration of the mould surface 1 with extreme accuracy. Therefore, it is expected in most cases that minimal finishing is required of the first surface or internal surface of the blank as shown on the preferred embodiment of the drawings.

Therefore, the invention provides significant advantage over prior art methods of forming sheet metal components. A one piece seamless component can be formed to virtually any configuration desired by the designers and it is not limited to fabrications which can be assembled by sheet metal forming and welding techniques as conventionally used. The amount of deformation that a sheet metal component can withstand during forming is limited. The shapes that can be formed and the extent to which material flows predictably during the forming process impose severe limitations on the shapes that can be practically fabricated. The introduction of heat and surface discontinuities resulting from welding are completely avoided by the invention as well as the thermally induced stresses from welding and the mechanical stresses from cold working during forming.

The nickel vapour deposition process produces an extremely smooth aerodynamically superior surface within an absolutely clean controlled atmosphere. By controlling the nickel vapour deposition process parameters, the hardness, strength and composition of the nickel deposited can be strictly controlled and reproduced. In contrast, the results from fitting and welding individual components are highly dependent on the skill of welders and those involved in forming the individual components prior to welding.

Although nickel deposition is a relatively slow process, compared to conventional sheet metal forming and welding, the manufacturing process can be adapted to compensate for longer residence times in the nickel vapour deposition chambers since the end result is a sheet metal product which is highly accurate, less costly to manufacture, has superior aerodynamic surface finish, and is produced in an absolutely controllable environment where parameters can be set and reproduced with extreme accuracy. The ability to form more than one part in the deposition chamber at a time also exists.

Although the above description relates to a specific preferred embodiment as presently contemplated by the inventors, it will be understood that the invention in its broad aspect includes mechanical and functional equivalents of the elements described herein.

We claim:

1. A method of manufacturing a seamless self-supporting metal part using nickel vapour deposition, the part having a selected minimum thickness, a first aerodynamically contoured surface and a second substantially parallel surface, the method comprising the steps of:

fabricating a mould with at least one mould surface comprising a negative of the first surface of the part, said mould including a plurality of removable reusable mould segments;

enclosing the mould in a nickel vapour deposition chamber;

depositing nickel on the mould surface by nickel vapour deposition until a blank of nickel is deposited having at least said minimum thickness, and an external surface; and separating the blank from the mould by individually withdrawing the reusable mould segments intact from the mould assembly and then individually removing the reusable mould segments intact from the blank.

2. A method according to claim 1 wherein the mould and nickel layer are heated during nickel vapour deposition.

3. A method according to claim 1 wherein the mould surface is an exterior surface and wherein the segments are inwardly removable.

4. A method according to claim 3 wherein the mould comprises an annular assembly of alternating first block segments having parallel side surfaces and second block segments having side surfaces abutting said parallel surfaces, the second block side surfaces being disposed at an acute angle relative to each other.

5. A method according to claim 1 including the step of:

masking a portion of the mould.

6. A method according to claim 1 wherein said mould is an annular assembly of said segments.

7. A method according to claim 1 wherein the mould segments co-operate to form the at least one mould surface.

8. A method according to claim 1 wherein the mould segments have side surfaces adapted to co-operate with the side surfaces of adjacent mould segments.

9. A method of manufacturing a metal part using nickel vapour deposition, the part having an interior, an internal contoured surface, an external surface and a thickness, the method comprising the steps of:

providing a mould assembly having a plurality of reusable mould segments and an exterior mould surface, the exterior mould surface forming a negative of at least a portion of the internal surface of the part;

depositing nickel around the mould assembly on the exterior mould surface by a nickel vapour deposition process to provide the part, the mould assembly being at least partially disposed in said part interior; and separating the part from the mould assembly by disassembling the mould assembly, said disassembling step including individually withdrawing the reusable mould segments intact from the mould assembly and individually removing the reusable mould segments intact from the interior of the part.

10. A method according to claim 9 wherein the mould segments are withdrawn inwardly of the mould assembly.

11. A method according to claim 9 wherein the mould assembly is annular.

12. A method according to claim 9 wherein said mould segments co-operate to form the exterior mould surface.

13. A method according to claim 9 wherein the mould segments have side surfaces mating with the side surfaces of adjacent mould segments.

14. A method according to claim 13 wherein the mould segments have side surfaces that slide on the adjacent mould segments when withdrawn relative to one another.

15. A method of manufacturing a metal part using nickel vapour deposition, the part having a thickness, a contoured first surface and a second surface, the second surface substantially parallel to the first surface, the method comprising the steps of:

providing a mould with at least one mould surface comprising a negative of the first surface of the part, said mould having a plurality of reusable mould segments;

depositing nickel on the mould surface by a nickel vapour deposition process to provide the part;

withdrawing a first portion of the plurality of mould segments from the mould assembly;

removing said first portion of the mould segments from the part;

withdrawing a remaining second portion of the mould segments from the mould assembly; and removing said second portion of the plurality of mould segments from the part.

* * * * *